United States Patent
Poddar et al.

(10) Patent No.: US 8,716,830 B2
(45) Date of Patent: May 6, 2014

(54) THERMALLY EFFICIENT INTEGRATED CIRCUIT PACKAGE

(75) Inventors: Anindya Poddar, Sunnyvale, CA (US); Luu T. Nguyen, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 321 days.

(21) Appl. No.: 13/304,167

(22) Filed: Nov. 23, 2011

(65) Prior Publication Data

US 2013/0127008 A1    May 23, 2013

(51) Int. Cl.
*H01L 21/70*    (2006.01)
(52) U.S. Cl.
USPC .................................. 257/522; 257/E21.573

(58) Field of Classification Search
USPC .......... 257/522, 723, E21.573, E23.013, 506, 257/513, 725, 685, E21.506
See application file for complete search history.

(56) References Cited

U.S. PATENT DOCUMENTS

| 6,173,490 B1 * | 1/2001 | Lee et al. ......................... 29/841 |
| 2003/0129272 A1 * | 7/2003 | Shen et al. ...................... 425/123 |

* cited by examiner

*Primary Examiner* — Selim Ahmed
(74) *Attorney, Agent, or Firm* — Eugene C. Conser; Wade J. Brady, III; Frederick J. Telecky, Jr.

(57) ABSTRACT

In one aspect of the present invention, an integrated circuit package will be described. The integrated circuit package includes at least two integrated circuits that are attached with a substrate. The integrated circuits and the substrates are at least partially encapsulated in a molding material. There is a groove or air gap that extends partially through the molding material and that is arranged to form a thermal barrier between the integrated circuits.

11 Claims, 6 Drawing Sheets

THERMALLY EFFICIENT INTEGRATED CIRCUIT PACKAGE

FIELD OF THE INVENTION

The present invention relates to packaging integrated circuits. More specifically, it relates to a package design that helps limit heat transfer between different sections of a package.

BACKGROUND OF THE INVENTION

There are a number of conventional processes for packaging integrated circuit (IC) dice. By way of example, many IC packages utilize a metallic leadframe. One or more dice may be electrically connected to the leadframe by means of bonding wires or solder bumps that have been preformed on the active surface of the die. In general, the dice and portions of the leadframe are encapsulated with a molding compound to protect the delicate electrical components on the active side of the die.

The dice within the package generate significant amounts of heat. Different package designs control heat buildup in a variety of ways. By way of example, a heat sink can be attached to one or more of the dice in the package. The heat sink may be exposed on the exterior of the package. That is, a surface of the heat sink is left uncovered by the molding compound. As a result, heat that is generated within the die can efficiently exit the package through the exposed surface.

There are a wide variety of other ways to improve the thermal performance of integrated circuit packages. For example, the die can be mounted on a die attach pad or heat spreader that is exposed on the exterior of the package. Thermal pipes can be provided within the package to help transfer heat from the die to the ambient environment. In some designs, the encapsulant does not entirely cover the die but instead leaves a surface of the die exposed. The package size can be increased so that heat can be more easily dissipated by convection along the sides of the package. In some applications, air flow can be directed to cool the package.

While existing arrangements and methods for packaging dice work well, there are continuing efforts to develop improved packaging techniques that provide cost effective approaches for meeting the needs of a variety of different packaging applications.

SUMMARY OF THE INVENTION

In one aspect of the present invention, an integrated circuit package will be described. The package includes at least two integrated circuits that are electrically and physically attached to a substrate. The integrated circuits and the substrate are at least partially encapsulated in a molding material. There is a groove that extends partially through the molding material and that is arranged to form a thermal barrier between the integrated circuits.

Various implementations involve the formation of an air gap in the groove that helps thermally isolate the integrated circuits from one another. In some embodiments, the air gap is large enough such that there is convective air flow through the groove. A groove width of approximately 0.5 mm or more works well for various applications. Generally, the groove penetrates partially but not entirely through the molding material of the package. In various embodiments, the groove leaves at least a 100 micron thick layer of molding material over the substrate to help ensure that the package has sufficient structural integrity.

Various package designs involve additional features that help improve heat dissipation from the package or help limit the internal transfer of heat between integrated circuits. By way of example, one or more of the integrated circuits may be attached to a heat sink or a metal clip. Portions of the integrated circuits, heat sink and/or metal clip may be exposed on the exterior of the package. In some embodiments, the integrated circuits are positioned on separate die attach pads and/or are electrically and physically connected with thin conductive traces that extend along the substrate. The width and dimensions of the conductive traces may be minimized or reduced to help limit heat transfer through the traces.

Another aspect of the present invention relates to a method for forming the aforementioned integrated circuit package.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More specifically, the present invention relates to a package design that helps limit heat transfer between integrated circuits or electrical devices in the package.

When electrical devices (e.g., integrated circuits, passive devices, etc.) are encapsulated in a molding compound to form a single package, heat can transfer from one device to another through the molding compound. One of the devices may be more thermally sensitive i.e., is arranged to operate at a lower temperature than another device in the package. The aforementioned heat transfer can adversely affect the thermally sensitive component.

Various techniques can be used to reduce the transfer of heat to the thermally sensitive component. The distance between the integrated circuits could be increased. Alternatively, the overall external surface area of the package could be expanded, which facilitates heat transfer from the package to the ambient environment. However, these steps involve an increase in the size of the package, which for various applications is undesirable from board footprint and cost considerations.

Figure 1A:
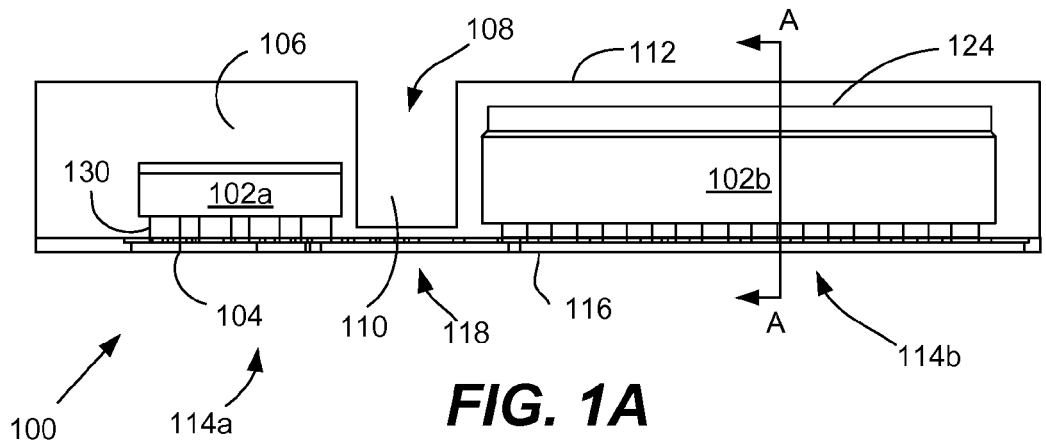
FIGS. 1A and 1B are diagrammatic side and perspective views of an integrated circuit package with an air gap according to a particular embodiment of the present invention.
Figure 1B:
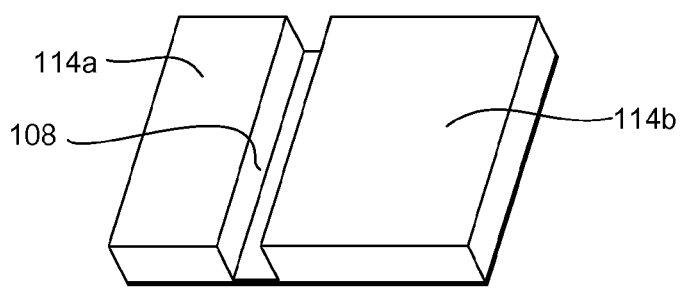

Various embodiments of the present invention address one or more of the above concerns. Referring initially to FIGS. 1A and 1B, an integrated circuit package 100 with an air gap according to a particular embodiment of the present invention will be described. FIGS. 1A and 1B are diagrammatic side and perspective views of an integrated circuit package 100 that includes a first integrated circuit 102a and a second integrated circuit 102b that are physically and electrically attached to a substrate 104. The substrate 104 may be a metal leadframe or other electronic substrate such as ceramic, organic, or ceramic-metal hybrid substrate e.g., such as Direct bonded Copper (DBC) or Direct Bonded Aluminum (DBA.) The integrated circuits and the substrate are at least partially encapsulated in a molding material 106. There is a groove 108 in the molding material 106 that forms an air gap 110 between the integrated circuits.

The groove 108 is arranged to limit heat transfer between the first and second integrated circuits 102a/102b. Instead of being filled in with molding material 106, which would allow heat to pass between the integrated circuits and through the molding material, the groove is filled with air. The air in the groove 108, which forms an air gap 110, has a substantially lower thermal conductivity than the molding material 106. Accordingly, the air gap 110 helps shield the first integrated circuit 102a from heat that is generated by the second integrated circuit 102b.

The groove 108 can take various forms, depending on the needs of a particular application. In the illustrated embodiment, for example, the groove 108 forms an open recess in a top surface 112 of the package 100 that penetrates partially but not completely through the package 100. The groove 108 effectively defines two sections in the package (a first section 114a and a second section 114b), which contain first and second integrated circuits 102a/102b, respectively. The two sections are separated by the air gap 110, have a common bottom surface 116 and are coupled through a bridge portion 118 that directly underlies the groove 108.

Figure 1C:
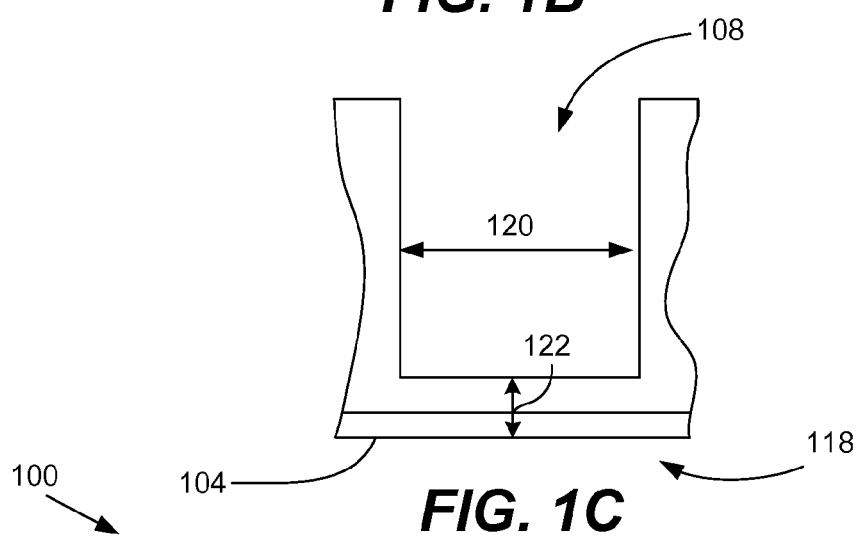
FIG. 1C is an enlarged view of the groove and bridge portion of the integrated circuit package illustrated in FIG. 1A.

FIG. 1C is an enlarged side view of the groove 108 and the bridge portion 118 illustrated in FIG. 1A. It is generally desirable to have the width 120 of the groove 108 (i.e., the distance between opposing sidewalls of the groove 108) be large enough such that there is convective air flow through the groove 108. This helps transfer heat out of the package 100. If the width 120 of the groove 108 is too small, the air can be trapped and the heat can build up in the groove 108. A width 120 of at least 0.5 mm or 0.6 mm works well for various applications. In some embodiments, the width of the groove is between 0.4 mm and 1.0 mm.

The bridge portion 118 of the package, which underlies the groove 108 and connects the two sections of the package, should be thick enough such that the package 100 has sufficient structural rigidity, yet thin enough so that the adjacent groove 108 serves as an effective thermal barrier. Some implementations involve a bridge portion 118 whose depth 122 is at least 100 microns. This depth 122 includes the thickness of the substrate 104 and/or a layer of molding material that is sandwiched between the groove 108 and the substrate 104.

The number of sections and the arrangement of the groove(s) may vary between different implementations. In the drawings, for example, the integrated circuit package 100 includes a single groove 108 and air gap 110 that forms a thermal barrier between two sections of the package. Each section 114a/114b contains at least one integrated circuit. In other implementations, there can be more than one groove that divides the package into more than two sections. Each section can contain one or more devices (e.g., passive devices) and/or integrated circuits. By way of example, the groove may be positioned between integrated circuits, between an integrated circuit and one or more passive devices, etc.

For various applications, it is preferable to have the groove 108 be open to the ambient environment such that air can flow freely through the groove. While it is possible to fill the groove with an insulating material, this approach involves an additional process step. There is also a risk that the insulating material may later delaminate from the surrounding molding material.

Figure 1D:
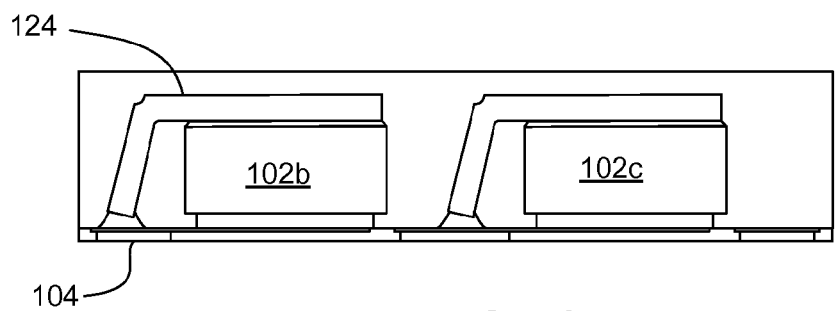
FIG. 1D is a diagrammatic cross-sectional view of the integrated circuit package illustrated in FIG. 1A as seen from plane A-A.

The integrated circuit package 100 may include additional features to further facilitate heat dissipation. In the illustrated embodiment, for example, the top surface of the second integrated circuit 102b is physically and thermally coupled to a metal clip 124. This is more easily seen in FIG. 1D, which is a diagrammatic cross-sectional view of the integrated circuit package 100 illustrated in FIG. 1A as seen from the plane A-A. In FIG. 1D, the second integrated circuit 102b and a third integrated circuit 102c are shown. (In FIG. 1A, the third integrated circuit 102c is positioned behind the second integrated circuit 102b and thus is not visible.) An L-shaped metal clip 124 is attached to each of the integrated circuits in FIG. 1D and the underlying substrate 104.

The metal clip 124 provides an additional path for heat to travel out of the integrated circuit package 100. That is, there are two paths for heat to escape from the second integrated circuit 102b to the exterior of the package. In the illustrated embodiment, heat is transferred to the ambient environment from the active surface of the second integrated circuit 102b through the underlying substrate 104. Heat is also transferred out of the second integrated circuit 102b via its back surface through the clip 124. The heat then travels around the L-shaped clip and is transferred out of the package 100 through the exposed substrate 104 on the bottom of the package.

Figure 6:
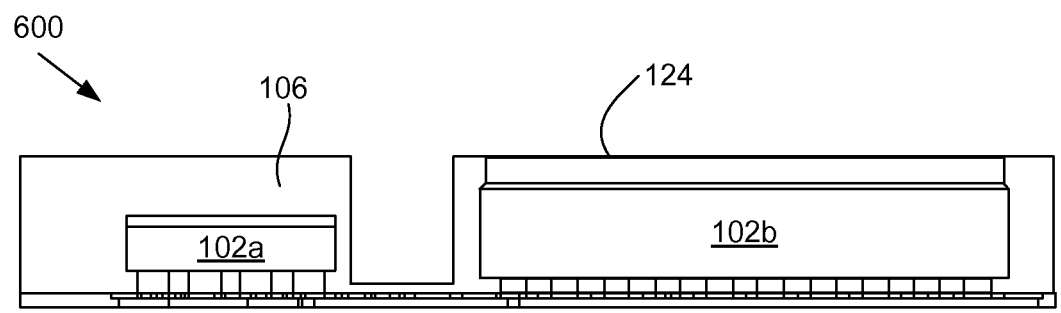
FIG. 6 is a diagrammatic side view of an integrated circuit package with an exposed metal clip according to a particular embodiment of the present invention.

Although the top surface of the clip 124 is covered with molding material in the drawing, some embodiments involve a clip 124 that is exposed on the top surface of the package. An example of an integrated circuit package 600 with an exposed clip 124 is illustrated in FIG. 6. The illustrated package 600 is almost identical to the package 100 illustrated in FIG. 1A, except that the molding material 106 does not cover a portion of the clip 124. This can allow heat to be transferred more quickly from the integrated circuit 102b to the ambient environment. The metal clip 124 may be made of any suitable thermally conductive material, such as copper.

The substrate 104 may have any suitable design or arrangement. In the illustrated embodiment, the substrate 104 includes electrically conductive traces that connect multiple integrated circuit die bonding sites. The bonding sites and the traces may be embedded in a dielectric material, such as a molding compound. Some implementations involve a substrate that is a metallic leadframe and/or that is formed from ceramic or organic materials.

The substrate and conductive traces may be arranged to help limit the conduction of heat between different integrated circuits in the package. In FIG. 1A, for example, the substrate 104 includes one or more relatively thin conductive traces that electrically and physically connect the active surfaces of the first and second integrated circuits 102a/102b. By decreasing the size and dimensions of the traces, the transfer of heat through the substrate 104 and between the integrated circuits can be reduced.

Figure 5:
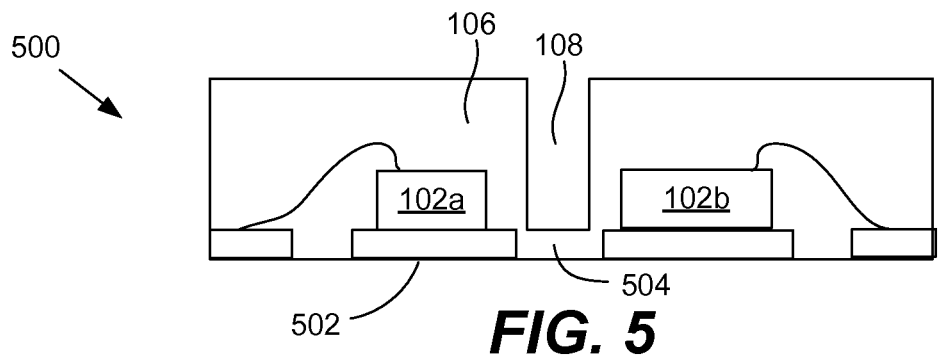
FIG. 5 is a diagrammatic side view of an integrated circuit package with separate die attach pads and wire bonded dice according to a particular embodiment of the present invention.

In various embodiments, the substrate 104 includes one or more die attach pads that are exposed on the exterior of the integrated circuit package. The exposed surfaces help further improve the thermal efficiency of the package. An example of an integrated circuit package 500 involving exposed die attach pads 502 is shown in FIG. 5. With respect to its groove 108, molding material 106 and integrated circuits 102a and 102b, the integrated circuit package 500 may have features similar or identical to the integrated circuit package 100 illustrated in FIG. 1A. The integrated circuit package 500 also includes a leadframe with die attach pads 502. In the illustrated embodiment, each die attach pad 502 has opposing top and bottom surfaces. The integrated circuits 102a/102b are physically attached to the top surfaces of the die attach pads 502. The bottom surface of the die attach pad 502 is exposed and not covered by the molding compound 106. The size of the die attach pads 502 can be enlarged and sized to further increase heat dissipation.

Another notable feature of the design illustrated in FIG. 5 is that the illustrated die attach pads 502 are physically separate from one another. That is, the integrated circuits 102a/102b are on different die attach pads 502 and are not necessarily electrically and physically attached to the same die attach pad. There is a gap 504 between the die attach pads 502 that is filled with molding material 106. This arrangement helps prevent heat from being easily transmitted from one integrated circuit to another through a shared, single die attach pad. It should be appreciated that the die attach pads 502 may be entirely separate or only partially separated (e.g., they may be connected by one or more conductive traces) and may be made from any suitable electrically conductive material (e.g., copper).

Figure 7:
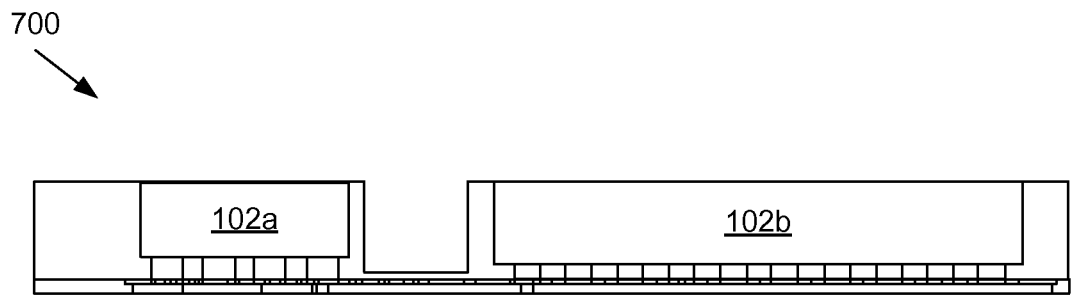
FIG. 7 is a diagrammatic side view of an integrated circuit package where the back surfaces of the dice are exposed according to a particular embodiment of the present invention.

In still other package designs, the back surface of the integrated circuits are exposed on the exterior of the package, which helps to dissipate heat from the integrated circuits to the ambient environment. FIG. 7 is a diagrammatic side view of an integrated circuit package 700 with exposed integrated circuits 102a/102b. (In other respects, integrated circuit package 700 may be identical to the integrated circuit package 100 illustrated in FIG. 1A). In some designs, the back surfaces of the integrated circuits 702 are covered with a thin metallic layer and/or attached with a heat sink.

The sections of the package, which are partially separated by the groove 108, may each house components that are designed to operate at substantially different temperatures. The air gap between the sections therefore helps to prevent heat from the "hotter" section from transferring into the "cooler" section. In some embodiments, the components in the first section 114a have a maximum recommended temperature that is at least 25% lower than that of the second section 114b. In one example, the first integrated circuit 102a is a silicon controller die that is arranged to operate at temperatures up to 125° C., and the second and third integrated circuits 102b/102c are field effect transistors that are arranged to operate at temperatures above 200° C. Instead of or in addition to one or more integrated circuits, each section of the package 100 may include one or more other electrical devices, such as inductors, diodes, any other passive devices, etc.

The integrated circuits may be arranged in a wide variety of ways, depending on the needs of a particular application. In the illustrated embodiment, for example, the first integrated circuit die 102a is a silicon controller die and the second and third integrated circuit dice 102b/102c are field effect transistors. The package 100 may include other types or different numbers of integrated circuits. The integrated circuits may be attached to the underlying substrate 104 using any suitable means. In FIG. 1A, for example, the active surfaces of the integrated circuits are directly attached to an underlying substrate 104 using solder joints 130, although it should be appreciated that the integrated circuits may be electrically and physically attached to the substrate 104 using any known technique. In FIG. 5, for example, the integrated circuits are wirebonded to the substrate 104.

Figure 2:
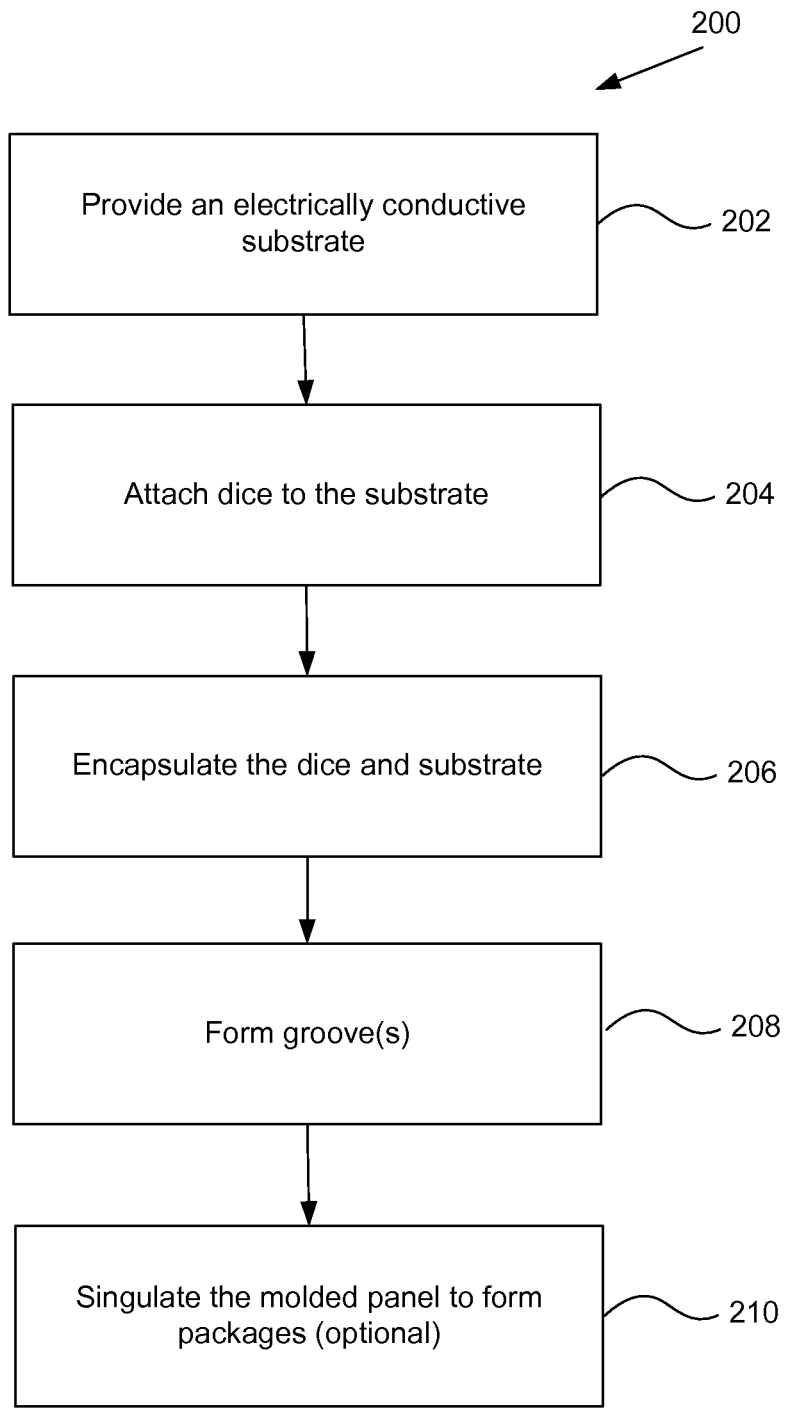
FIG. 2 is a flow diagram illustrating steps in a method for forming the integrated circuit package illustrated in FIG. 1A.
Figure 3A:
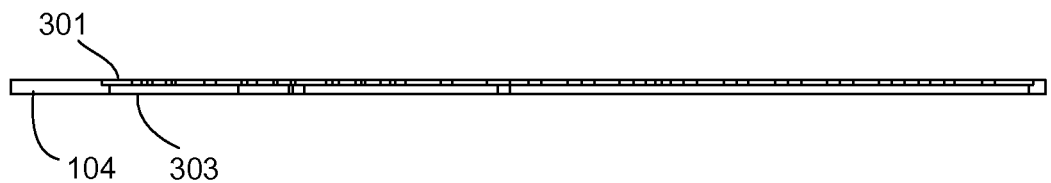
FIGS. 3A-3H are diagrammatic views of various steps in the method illustrated in FIG. 2 according to a particular embodiment of the present invention.
Figure 3B:
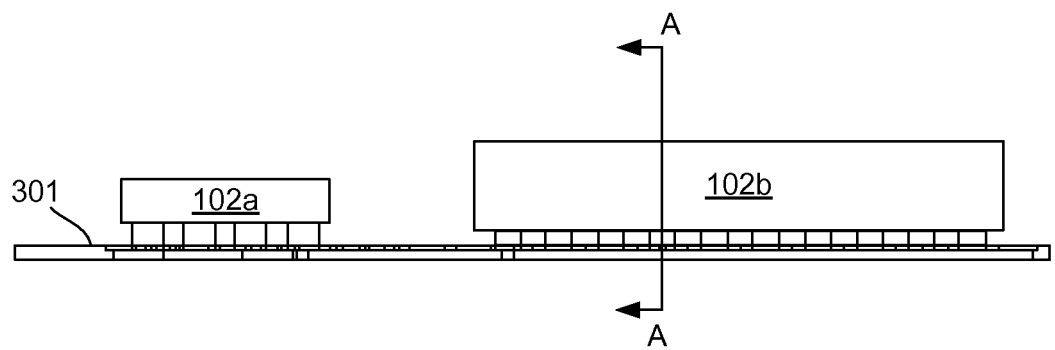
Figure 3C:
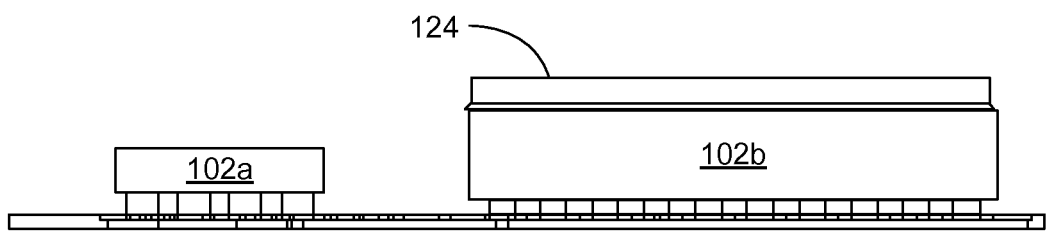

Referring next to FIG. 2 and FIGS. 3A-3H, a method 200 for forming the integrated circuit package 100 illustrated in FIG. 1A according to a particular embodiment of the present invention will be described. Initially, at step 202, an electrically conductive substrate 104 of FIG. 3A is provided. In FIG. 3A, the substrate 104 is a portion of a molded leadframe panel, although any suitable substrate design and material may be used. By way of example, the substrate may be a metallic leadframe or formed from ceramic or organic materials.

Figure 4A:
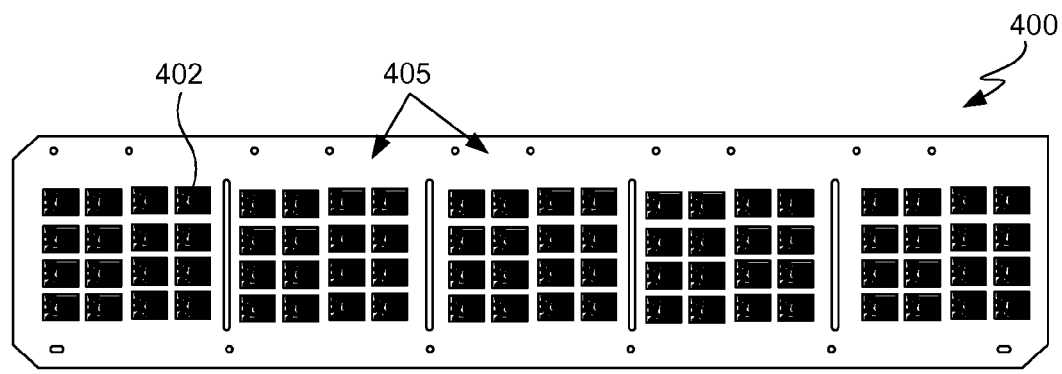
FIG. 4A is a diagrammatic top view of a leadframe panel according to a particular embodiment of the present invention.
Figure 4B:
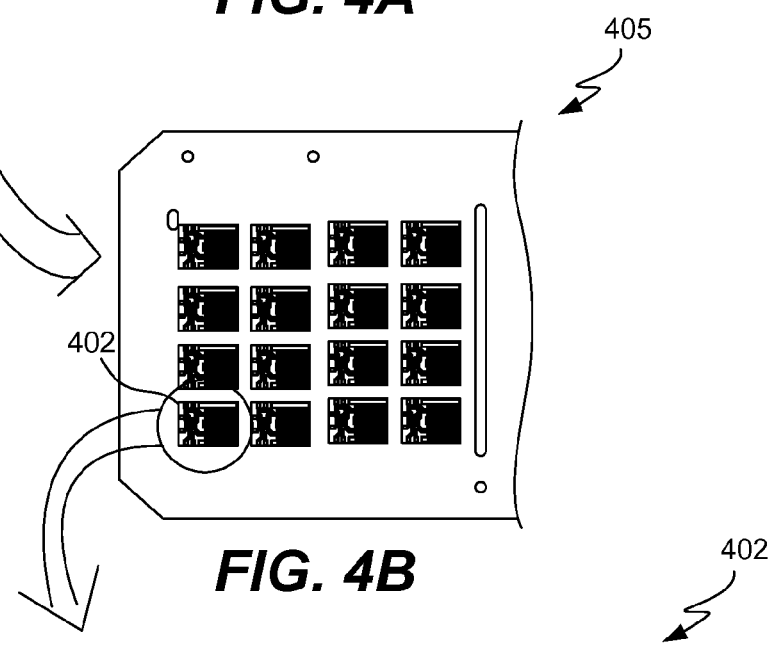
FIG. 4B is a diagrammatic enlarged view of a portion of the leadframe panel illustrated in FIG. 4A.

FIG. 4A is a diagrammatic top view of the molded leadframe panel 400 illustrated in FIG. 3A. The panel 400 includes an electrical interconnect that is embedded in a dielectric material (e.g., molding material). The electrical interconnect, which may be formed from any suitable electrically conductive material (e.g., copper), defines multiple device areas 402 in the panel. Each device area 402 is arranged to connect to and support one or more integrated circuits. In the illustrated embodiment, the device areas 402 are arranged in two dimensional arrays 405 that extend along the length of the panel. FIG. 4B is a top view of one such array 405.

Figure 4C:
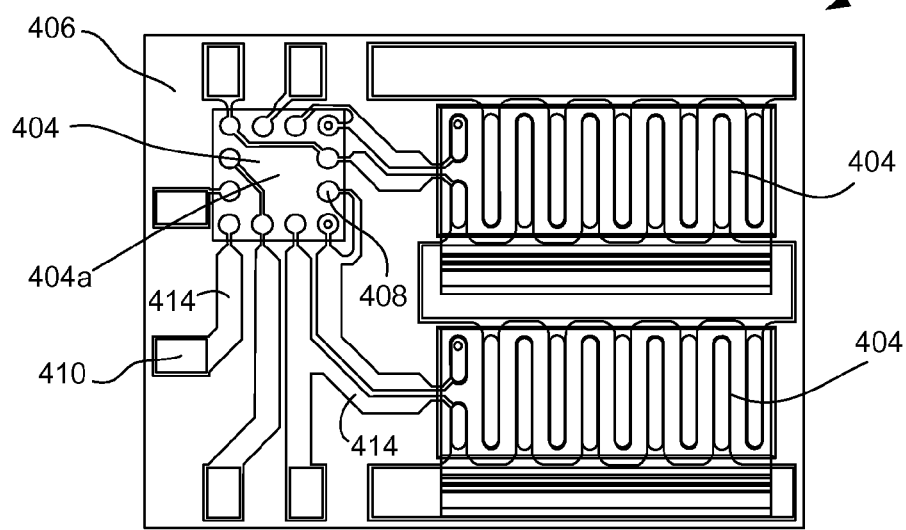
FIG. 4C is a diagrammatic enlarged view of a device area illustrated in FIGS. 4A and 4B.

FIG. 4C is an enlarged, diagrammatic top view of an individual device area 402 illustrated in FIG. 4A. The device area 402 includes multiple die attachment sites 404 and conductive traces 414 that are held together by molding material 406. A first die attachment site 404a includes solder pads 408 that are exposed on a top surface of the panel 400 (e.g., top surface 301 of the substrate 104 in FIG. 3A) and that are arranged to be physically and electrically connected to the active surface of an integrated circuit. Various conductive traces 414 connect the solder pads 408 to other die attachment sites and/or to external contacts 410 that are exposed on a bottom surface of the panel 400 (e.g., bottom surface 303 of substrate 104 of FIG. 3A). Accordingly, the conductive traces 414 can be used to electrically and physically connect one integrated circuit to another integrated circuit and/or to an external device.

Heat transfers rapidly through metallic and electrically conductive materials, such as those used to form the conductive traces. In some applications, it is therefore desirable to minimize the dimensions of the conductive traces, particularly those traces that connect separate die attachment sites. This approach helps to limit the amount of heat that is transferred between the connected integrated circuits. In FIG. 4C, for example, there are large gaps between different die attachment sites that are filled with molding material. These gaps are bridged by one or more relatively thin, narrow conductive traces 414.

At step 204 of FIG. 2, first and second integrated circuits 102a/102b are attached to the top surface 301 of the substrate 104. The integrated circuits may be attached to the underlying die attachment sites in any suitable manner (e.g., wire bonding, solder joints, etc). The illustrated embodiment of FIG. 3B involves a flip chip-style arrangement. In this example, the active surfaces of the integrated circuits include bond pads that are covered with solder bumps. The bond pads are aligned over the solder pads of the die attachment sites. A reflow process is performed to attach the bond pads of the integrated circuits to the solder pads of the die attachment sites. Accordingly, the integrated circuits are attached via solder joints to the die attachment sites of the panel.

Figure 3D:
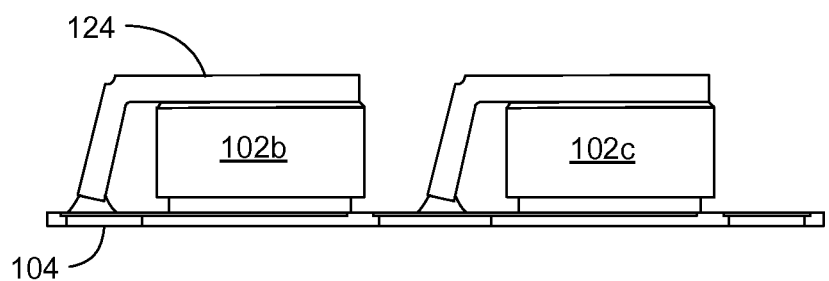

Optionally, additional components or materials may then be added to the substrate and/or the integrated circuits. By way of example, a heat sink may be attached to the non-active, back surface of one or more of the integrated circuits. Some approaches involve applying a low thermal conductivity material (e.g., k<0.1 W/mK, where K is the thermal conductivity of the material) to at least a portion of an integrated circuit. In the illustrated embodiment of FIG. 3C, a metal clip 124 is attached to one or more of the integrated circuits. FIG. 3D provides a view of the metal clips 124 from a different angle (i.e., as seen from the plane A-A).

In the illustrated embodiment, the metal clips 124 generally have an L-like shape and are arranged to curve around a top edge corner of the second integrated circuit 102b. That is, a first portion of the metal clip 124 overlies and is attached to a back surface of the second integrated circuit 102b. A second portion of the metal clip 124, which extends at an angle from the first portion, is attached to the underlying substrate 104 and overlies a sidewall of the second integrated circuit 102b. In various embodiments, the metal clip 124 is attached to a pad (e.g., a die attach pad that underlies the connected integrated circuit) or other structure that is exposed at the bottom of the substrate 104. As a result, heat can be transferred quickly from the back surface of the integrated circuit to the ambient environment through the metal clip 124.

The metal clips 124 may be attached to the substrate 104 and integrated circuits using any suitable technique. By way of example, the clips 124 may be soldered to the back surfaces of the integrated circuits and/or the substrate 104. Thermal grease, an adhesive and/or molding material can also be used to bond the clips 124 to the substrate 104.

Figure 3E:
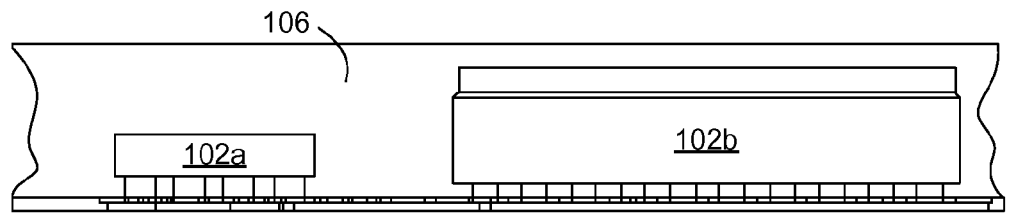

Afterward, at least portions of the integrated circuits 102a/102b and the substrate 104 are encapsulated in a molding material 106 to form a molded substrate or panel (step 206 and FIG. 3E). Various components, such as the back surfaces of the integrated circuits 102a/102b and/or top surfaces of the metal clips 124, may or may not be covered with the molding material 106. In the illustrated embodiment, the encapsulation process fills in the space between the first and second integrated circuits 102a/102b with molding material 106 and forms a molded panel 320 with a generally flat top surface that spans multiple die attachment sites and device areas.

Figure 3F:
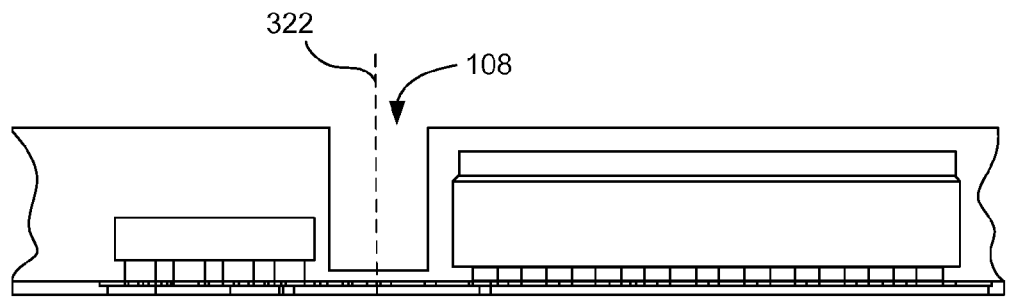
Figure 3G:
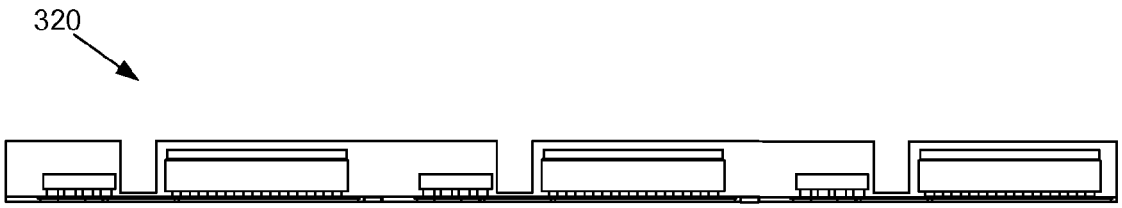

At step 308 and FIGS. 3F and 3G, one or more grooves 108 are formed in the molded panel. (FIG. 3F focuses on a single device area and groove, while FIG. 3G is a diagrammatic side view of multiple device areas and grooves of the same panel). The groove 108 forms an air gap between integrated circuits in the same device area. The groove 108 may be formed using any known technique, such as sawing, laser cutting etc. If a saw blade is used, multiple passes may be required to complete the formation of a single groove, since in various applications the width of the groove is two or more times larger than the width of the saw blade. In various implementations, the groove is formed such that its width is approximately at least 0.6 mm.

Generally, the cutting process penetrates partially but not entirely through the molded panel 320. That is, if the cutting process is performed along a reference cutting plane 322, there is a remaining portion of the panel (referred to in FIG. 1A as the bridge portion 118) that lies along the cutting plane but that was not penetrated by the cutting process. Ideally, the thickness of the remaining portion (i.e., the depth of the bridge portion 118) should be large enough such it retains sufficient stiffness to resist bending and warpage. In various embodiments, the cutting process is performed such that this thickness is at least approximately 4 mils or 100 microns.

Figure 3H:

At step 210 and FIG. 3H, the molded panel 320 is singulated to form individual integrated circuit packages. It should be noted that the singulation process (step 210) and the process for forming the grooves (step 208) may be performed in any order or concurrently. Generally, the singulation of the molded panel involves cutting the panel along lines that divide the various device areas. Accordingly, multiple copies of the integrated circuit package 100 illustrated in FIG. 1A are formed. In this example, each one of the singulated packages 100 includes at least two integrated circuits and at least one groove.

Although only a few embodiments of the invention have been described in detail, it should be appreciated that the invention may be implemented in many other forms without departing from the spirit or scope of the invention. It should be appreciated that the present invention contemplates details that can be inferred from the drawings but that are not explicitly described in the written specification. By way of example, there are multiple ways to describe various features of the groove and bridge portion illustrated in FIG. 1C. Various implementations involve a groove that extends more than halfway through the thickness of the package. In a particular approach, the sidewalls of the groove are substantially parallel to and overlie the (entire) sidewall(s) of an adjacent die or dice. In some embodiments, the width of the groove may be understood as the distance between two (opposing) surfaces that form the sidewalls of the groove. The surfaces may or may not be perpendicular to a top surface of the package. In some designs, the bridge portion may be defined as a portion of the package that is sandwiched between the bottom surface of the groove (which may be substantially perpendicular to the sidewall surfaces and forms a bottom of a recess in the top surface of the package) and the bottom surface of the package. It should also be appreciated that while FIGS. 3A-3F illustrate the steps of method 200 of FIG. 2 being applied to one device area at a time, the steps can also be applied substantially concurrently on multiple device areas in a leadframe panel (e.g., the device areas 402 of leadframe panel 400). In this application, one (first) device is sometimes referred as being more temperature sensitive than another (second) device. For various embodiments, the phrase can mean that the first device is designed to operate normally up to a maximum temperature that is lower than the corresponding maximum temperature of the second device (i.e., should the maximum temperature be exceeded, the device will not function normally or has a substantial risk of failing to function normally). Therefore, the present embodiments should be considered as illustrative and not restrictive and the invention is not limited to the details given herein, but may be modified within the scope and equivalents of the appended claims.

What is claimed is:

1. An integrated circuit package comprising:
a plurality of integrated circuits including a first integrated circuit and a second integrated circuit;
a substrate that is electrically and physically connected to the first and second integrated circuits;
wherein the substrate includes a plurality of die attach pads including a first die attach pad that supports the first integrated circuit and a second die attach pad that supports the second integrated circuit, wherein the first and second die attach pads are separated from one another;
a metal clip that is coupled with a top surface of the second integrated circuit and is also coupled to the substrate;
wherein a bottom surface of the second integrated circuit is attached to the second die attach pad whereby the clip and the die attach pad cooperate to provide two paths for transferring heat from the second integrated circuit away from the package;
wherein a portion of the metal clip is exposed on the exterior of the package;
wherein a back surface of one of the integrated circuits is exposed on an exterior of the package;
a plurality of passive devices wherein:
the plurality of integrated circuits and the plurality of passive devices are electrical devices;
some of the electrical devices are more temperature sensitive than others of the electrical devices; and
a groove that separates the more temperature sensitive devices from the less temperature sensitive devices;
a molding material that at least partially encapsulates the first integrated circuit, the second integrated circuit and the substrate; and
the groove that extends partially through the molding material between the first integrated circuit and the second integrated circuit to help provide a thermal barrier between the first integrated circuit and the second integrated circuit.

2. An integrated circuit package as recited in claim 1 wherein the groove forms an air gap that helps thermally isolate the first and second integrated circuits.

3. An integrated circuit package as recited in claim 1 wherein at least one of the die attach pads is exposed on the exterior of the integrated circuit package.

4. An integrated circuit package as recited in claim 1 wherein the groove is exposed, open and arranged to allow convective air flow through the groove and wherein the groove is not entirely filled with any solid insulating material.

5. An integrated circuit package as recited in claim 1 wherein the groove forms a gap between first and second sections of the integrated circuit package, which contain the first and second integrated circuits, respectively.

6. An integrated circuit package as recited in claim 5 wherein there is a bridge portion that underlies the groove and crosses the gap between the first and second sections of the package and wherein the depth of the bridge portion is at least 100 microns.

7. An integrated circuit package as recited in claim 1 wherein the width of the groove that separates the first section of the package from the second section of the package is at least 0.5 mm and wherein the width of the groove is arranged to allow convective air flow through the groove.

8. An integrated circuit package as recited in claim 1 wherein the substrate is selected from the group consisting of a leadframe, a ceramic substrate, a ceramic-metal hybrid substrate, a Direct Bonded Copper (DBC) substrate, a Direct Bonded Aluminum (DBA) substrate and an organic substrate.

9. An integrated circuit package as recited in claim 1 wherein the first integrated circuit is selectively coated with a low thermal conductivity material having k<0.1 W/mK and wherein the first integrated circuit is more temperature sensitive than the second integrated circuit.

10. An integrated circuit package as recited in claim 1 wherein the second integrated circuit is a field effect transistor die and the first integrated circuit is a silicon controller die.

11. An integrated circuit package as recited in claim 1 wherein:
the plurality of integrated circuits further comprises a third integrated circuit;
the first integrated circuit is a silicon controller die; and
the second and third integrated circuits are field effect transistor dies.

* * * * *